(12) United States Patent
Shedd

(10) Patent No.: US 12,432,886 B2
(45) Date of Patent: Sep. 30, 2025

(54) COMPACT HYBRID HEAT CAPTURE SYSTEM IN AN INFORMATION HANDLING SYSTEM

(71) Applicant: DELL PRODUCTS L.P., Round Rock, TX (US)

(72) Inventor: Timothy A. Shedd, Lithia, FL (US)

(73) Assignee: Dell Products L.P., Round Rock, TX (US)

( * ) Notice: Subject to any disclaimer, the term of this patent is extended or adjusted under 35 U.S.C. 154(b) by 221 days.

(21) Appl. No.: 18/460,307

(22) Filed: Sep. 1, 2023

(65) Prior Publication Data

US 2025/0081403 A1    Mar. 6, 2025

(51) Int. Cl.
 *H05K 7/20*    (2006.01)
(52) U.S. Cl.
 CPC ..... *H05K 7/20581* (2013.01); *H05K 7/20145* (2013.01); *H05K 7/20218* (2013.01); *H05K 7/20654* (2013.01)
(58) Field of Classification Search
 CPC ........... H05K 7/20781; H05K 7/20145; H05K 7/20736; H05K 7/20754; H05K 7/20818; H05K 7/20718; H05K 7/1488; H05K 7/20172; H05K 7/20572; H05K 7/20136; H05K 7/20181; H05K 7/206
 USPC .......... 361/696, 690, 695, 704, 679.48, 692, 361/694, 679.49, 679.54, 703, 701, 724; 165/104.33, 217, 294, 80.2; 312/236; 454/184
 See application file for complete search history.

(56) References Cited

U.S. PATENT DOCUMENTS

| | | | |
|---|---|---|---|
| 8,498,114 B2 * | 7/2013 | Martini | F24F 11/0001 361/679.5 |
| 10,939,587 B2 | 3/2021 | Curtis et al. | |
| 2008/0117592 A1 * | 5/2008 | Campbell | H05K 7/20736 361/694 |
| 2008/0278912 A1 * | 11/2008 | Zavadsky | H04Q 1/03 361/695 |
| 2009/0061755 A1 * | 3/2009 | Calder | H05K 7/20736 361/692 |
| 2009/0201640 A1 * | 8/2009 | Bard | H05K 7/20745 361/696 |
| 2012/0111533 A1 * | 5/2012 | Chen | H05K 7/20736 165/80.2 |
| 2013/0128455 A1 * | 5/2013 | Koblenz | H05K 7/20836 165/294 |

(Continued)

*Primary Examiner* — Mandeep S Buttar
(74) *Attorney, Agent, or Firm* — Larson Newman, LLP

(57) ABSTRACT

An information handling system includes a front door having a first frame, a main portion, and a rear portion. The main portion includes a second frame, a component node having multiple components, and a first channel. The rear portion includes a third frame, a cooling coil, a cooling fan, and a second channel. The information handling system is airtight when the first frame is in physical communication with a first end of the second frame and the third frame is in physical communication with a second end of the second frame. An airflow circulates within the information handling system to cool the components in the component node. The airflow circulates from the cooling coil to the cooling fan, through the second channel, through the first channel, through the component node, and back through the cooling coil.

20 Claims, 6 Drawing Sheets

(56) References Cited

U.S. PATENT DOCUMENTS

| | | | |
|---|---|---|---|
| 2013/0264026 A1* | 10/2013 | Eckberg | B23P 15/26 |
| | | | 165/67 |
| 2014/0071621 A1* | 3/2014 | Dong | H05K 7/20736 |
| | | | 361/692 |
| 2017/0181323 A1* | 6/2017 | Shelnutt | H05K 7/20772 |
| 2018/0295750 A1* | 10/2018 | Ortenzi | H05K 7/1488 |
| 2023/0221781 A1 | 7/2023 | Carver et al. | |

* cited by examiner

COMPACT HYBRID HEAT CAPTURE SYSTEM IN AN INFORMATION HANDLING SYSTEM

FIELD OF THE DISCLOSURE

The present disclosure generally relates to information handling systems, and more particularly relates to a compact hybrid heat capture system in an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a front door having a first frame, a main portion, and a rear portion. The main portion includes a second frame, a component node having multiple components, and a first channel. The rear portion includes a third frame, a cooling coil, a cooling fan, and a second channel. The information handling system may be airtight when the first frame is in physical communication with a first end of the second frame and the third frame is in physical communication with a second end of the second frame. An airflow may circulate within the information handling system to cool the components in the component node. The airflow may circulate from the cooling coil to the cooling fan, then through the second channel, through the first channel, through the component node, and back through the cooling coil.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
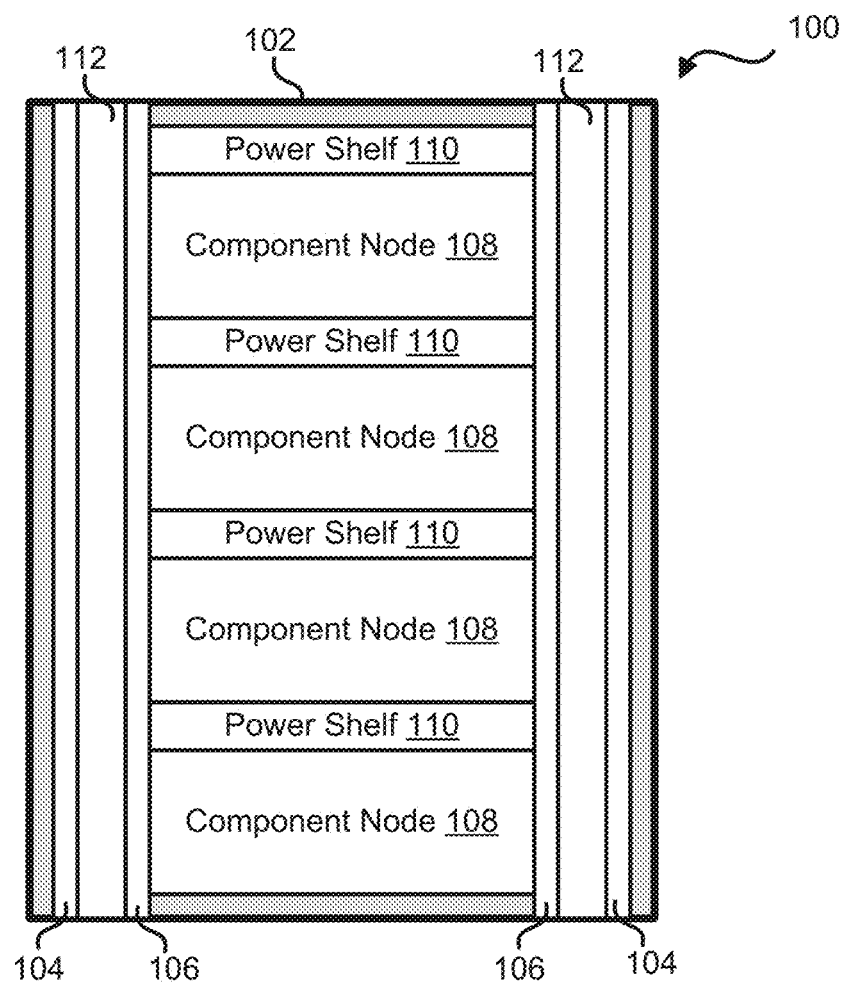
FIG. 1 is a front view of a main portion of an information handling system according to at least one embodiment of the present disclosure.

FIG. 1 illustrates a main portion 100 of an information handling system according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Main portion 100 includes a frame 102, supports 104 and 106, multiple component nodes 108, and multiple power shelves 110. Component nodes 108 and power shelves 110 may be mounted between mounting structures, such as mounting structures 520 of FIG. 5, connected to supports 106. In an example, the mounting of component nodes 108 and power shelves 110 to the support mounting structures may securely hold the component nodes and the power shelves within information handling system 100. In certain examples, the components of power shelves 110 may be substantially incorporated within component nodes 108, such that main portion 100 may not include the power shelves without varying from the scope of this disclosure. Main portion 100 may include additional components without varying from the scope of this disclosure.

In an example, one or more of component nodes 108 may be an information technology node and the other nodes may be compute nodes to perform processing operations for information handling system 100. Main portion 100 may include any suitable number of power shelves 110 to supply component nodes 108 with power. In certain examples, channels 112 may be located between supports 104 and 106. For example, one channel 112 may be located or formed between supports 104 and 106 on one side of main portion 100, and another channel 112 may be located or formed between supports 104 and 106 on the other side of the main portion. In an example, channels 112 may further be located between frame 102 and mounting structures, such as mounting structures 520 of FIG. 5, connected to supports 106. Channels 112 may direct airflow within main portion 100 as will be described with respect to FIG. 5 below.

Figure 2:
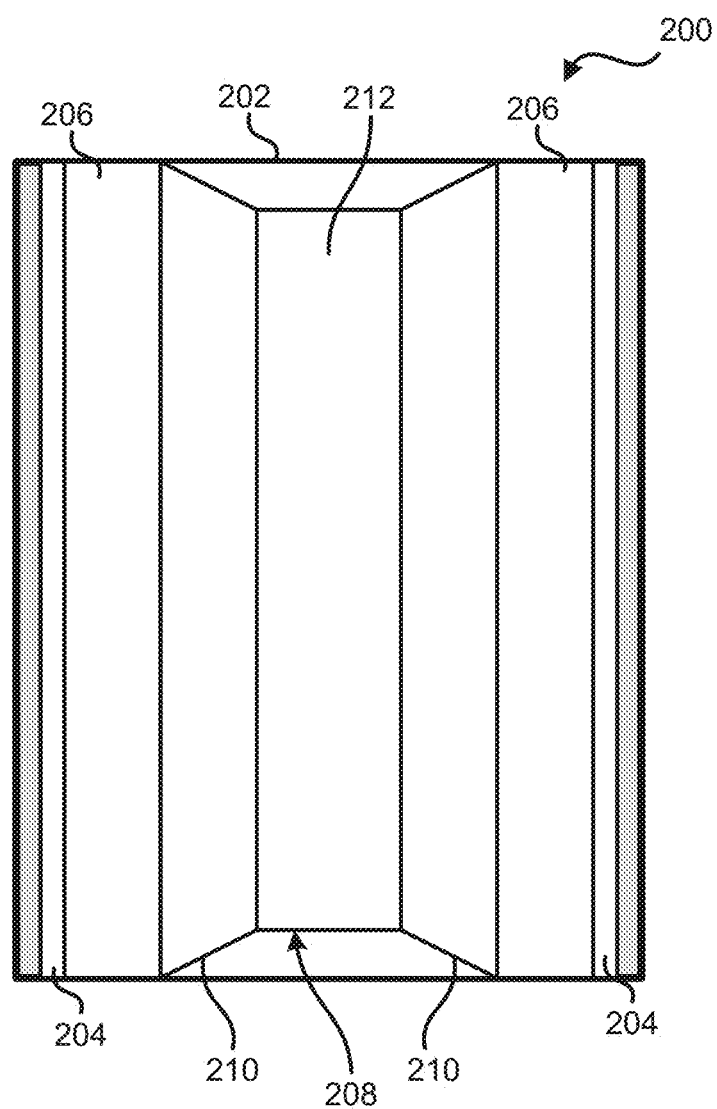
FIG. 2 is a back view of a front door of an information handling system according to at least one embodiment of the present disclosure.
Figure 5:
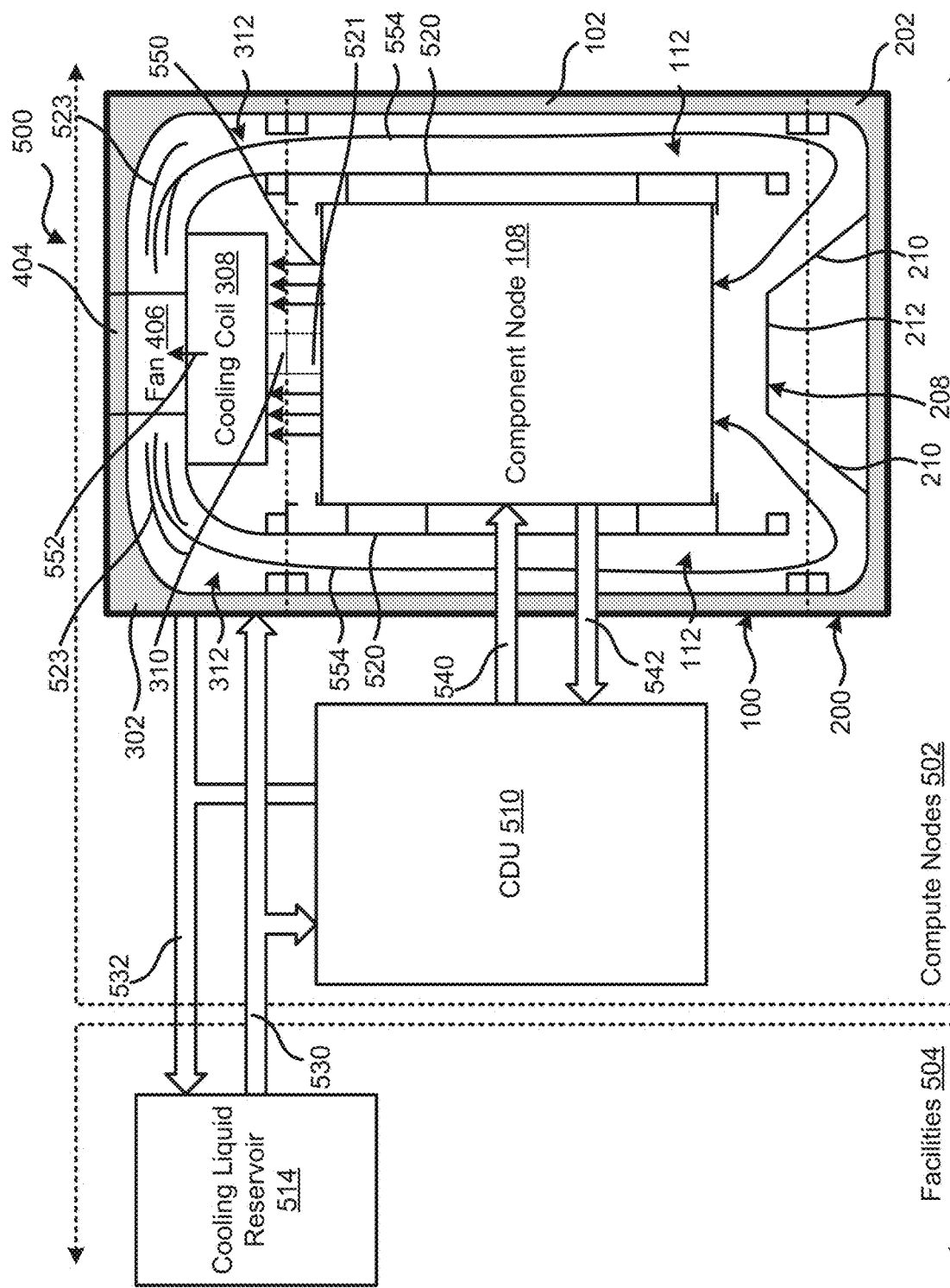
FIG. 5 is a top view of a compute node and cooling system according to at least one embodiment of the present disclosure.

FIG. 2 illustrates a front door 200 of an information handling system, such as information handling system 500 of FIG. 5, according to at least one embodiment of the present disclosure. Front door 200 includes a frame 202, supports 204, an inner surface 206, and an airflow director 208. Airflow director 208 includes angled portions 210, and a flat surface 212. Front door 200 may include additional components without varying from the scope of this disclosure.

In an example, when front door 200 is closed on main portion 100 of FIG. 1 frame 202 may be connected to and sealed with frame 102. Front door 200 may be connected to main portion 100 via any suitable manner, such as a hinge on one side of the front door and the corresponding side of the main portion. In this example, front door 200 may be securely mounted on main portion 100 of FIG. 1 via the hinge and may swing/rotate around the hinge to transition between an open position and a closed position. While front door 200 is in the closed position, as illustrated in FIG. 5, airflow may be kept within the information handling system. When front door 200 is in the open position, an individual may access component nodes 108 and power shelves 110 within main portion 100 of FIG. 1.

In certain examples, airflow director 208 may be securely mounted on inner surface 206 of front door 200. In an example, airflow director 208 may angle an airflow within an information handling system, such as information handling system 500 of FIG. 5, toward component nodes, such as component nodes 108 of FIG. 1. For example, as airflow hits inner surface 206, angled portions 210 may change the direction of the airflow and cause the airflow to travel or move toward the component nodes and power shelves of the information handling system as illustrated in FIG. 5. In different examples, the width of flat surface 212 may vary and the width of the flat surface may affect the direction or angle of the airflow towards the component nodes and power shelves of the information handling system.

Figure 3:
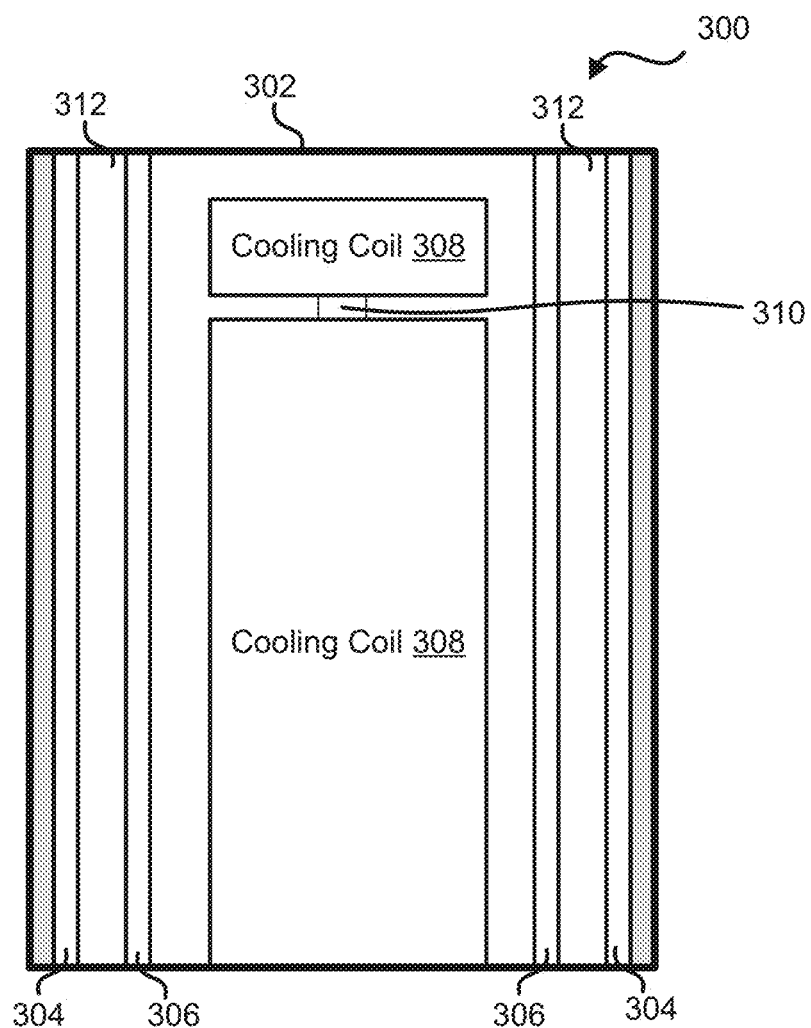
FIG. 3 is a front view of a rear portion of an information handling system according to at least one embodiment of the present disclosure.
Figure 4:
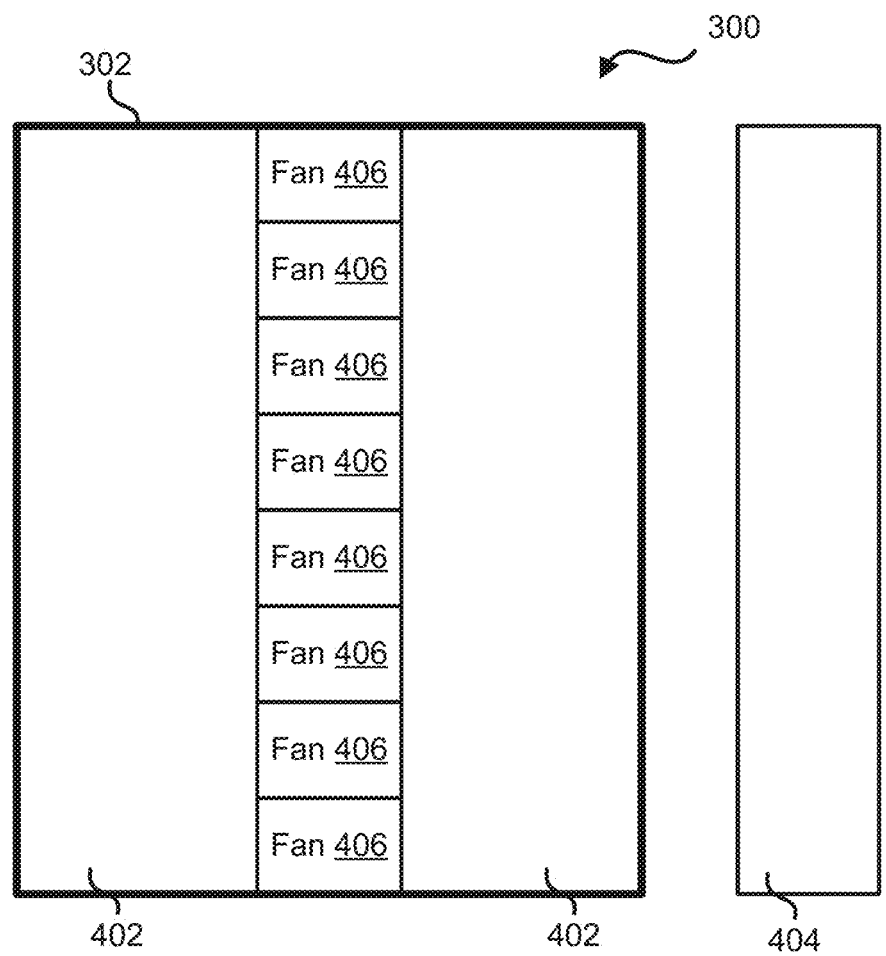
FIG. 4 is a back view of a rear portion of an information handling system according to at least one embodiment of the present disclosure.

FIGS. 3 and 4 illustrate a rear portion 300 of an information handling system according to at least one embodiment of the present disclosure. Referring to FIG. 3, rear portion 300 includes a frame 302, supports 304 and 306, cooling coils 308, a connect coupler 310, and a channel 312.

In an example, connect coupler 310 may be any suitable type of connector, such as a blind mate quick connect coupler, to provide power and communication signals from main portion 100 of FIG. 1 to components in rear portion 300. In certain examples, rear portion 300 may include multiple connect couplers 310 without varying from the scope of this disclosure. Rear portion 300 may include additional components without varying from the scope of this disclosure.

In certain examples, channels 312 may be located between supports 304 and 306. For example, one channel 312 may be located or formed between supports 304 and 306 on one side of rear portion 300, and another channel 312 may be located or formed between supports 304 and 306 on the other side of the main portion. In an example, channels 312 may further be located between frame 302 and mounting structures connected to supports 306. Channels 312 may direct airflow within rear portion 300 as will be described with respect to FIG. 5 below.

In an example, when rear portion 300 is closed on main portion 100 of FIG. 1 frame 302 may be connected to and sealed with frame 102. Rear portion 300 may be connected to main portion 100 via any suitable manner, such as frame 302 snap fitting with frame 102, latches holding rear portion to the main portion, or the like. While rear portion 300 is in the closed position, as illustrated in FIG. 5, the rear portion may be in physical communication and securely attached to main portion 100 of FIG. 1 so that airflow may be kept within the information handling system. When rear portion 300 is in the open position, an individual may access the back of component nodes 108 and power shelves 110 within main portion 100 of FIG. 1. In an example, rear portion 300 may be fully removed from main portion 100 of FIG. 1. When rear portion 300 is in the open position, the rear portion may no longer be in physical communication with main portion 100 of FIG. 1.

Referring to FIG. 4, rear portion 300 further includes a back surface 402, a removable panel 404, and multiple cooling fans 406. In an example, removable panel 404 may be securely attached to back surface 402 or may be removed from the back surface of rear portion 400 as illustrated in FIG. 4. When removable panel 404 is removed from back surface 402, an individual may access cooling fans 406 to service the fans, remove one or more fans, or the like. In an example, cooling fans 406 may be hot-swappable devices, such that failed cooling fans may be removed and new cooling fans may be connected to rear portion 300 while the information handling system is powered on.

FIG. 5 illustrates a system 500 including a compute node section 502 and a facilities section 504 according to at least one embodiment of the present disclosure. Compute node section 502 includes a cooling distribution unit (CDU) 510 and an information handling system 512. While cooling of the components within information handling system 512 will be described with respect to both direct liquid cooling from CDU 510 and the air cooling with cooling coils 308 and fans 406, the cooling may be performed only with the air cooling when the power usage within information handling system is below a particular threshold. In certain examples, information handling system 512 may be a server rack of any suitable height, such as nineteen inches, twenty inches, twenty-five inches, thirty inches, forty-five inches, sixty inches, seventy inches, seventy-two inches, eighty inches, or the like. Facilities section 504 includes a cooling liquid reservoir 514.

Information handling system 512 includes main portion 100, front door 200, and rear portion 300. When front door 200 and rear portion are both in the closed position, information handling system 512 may be substantially airtight. In an example, information handling system may include gaps for cables and liquid cooling pipes to ingress and egress the information handling system. The cables and liquid cooling pipes may be sealed with brush strips or foam to enable information handling system 512 to be substantially airtight based on airflow pressures inside the information handling system. Based on the airflow pressures, the amount of air leakage from information handling system 512 should be minimal, such that information handling system is substantially airtight. Main portion 100 includes mounting structures 520 mounted to supports 106, connect coupler 521, liquid cooling manifolds 522, frame 102, supports 104 and 106, component nodes 108, and power shelves 110 of FIG. 1. In certain examples, liquid cooling manifolds 522 may only be included within main portion 100 when information handling system includes liquid cooling of components. In an example, connect coupler 521 may be a power bus bar to enable blind mate power connection with connect coupler 310 of rear portion 300. Front door 200 includes frame 202, supports 204, inner surface 206, and airflow director 208. Rear portion 300 may include airflow directional vanes 523, airflow structures 524, cooling coils 308, removable panel 404, and fans 406. In an example, information handling system 512 may be a core frame without outer panels. In this example, frames 102 and 302 may be added to information handling system 512. The addition of frame 102 may create channels 112 and the addition of frame 302 may form channels 312. Information handling system 512 may include additional components without varying from the scope of this disclosure.

In an example, each of mounting structures 520 may extend from a corresponding one of supports 106 to the back of main portion 100. Mounting structures 520 may also extend from the bottom of main portion 100 to the top of the main portion, the mounting structures may be in physical communication with the bottom and the top so that the mounting structures are supported by the top and bottom of the main portion. Based on the location and support of mounting structures 520, the mounting structures may hold component nodes 108 and power shelves 110 of FIG. 1 within information handling system 512.

In certain examples, cooling liquid reservoir 514 may hold any suitable liquid available in facility section 504. For example, facility section 504 may have access to warm water and not cold water as may be available to other liquid cooling facilities. In an example, warm water may be within a temperature range of 30° C. (86° F.) to 32° C. (90° F.). Cooling liquid reservoir 514 may provide the cooling liquid to compute node section 502 via an inlet line 530 and receive the cooling liquid from the compute node section via a return line 532. In certain examples, inlet line 530 and return line 532 may be any suitable lines, such as rigid pipes, flexible hoses, or a combination of rigid pipes and flexible hoses, or the like, to allow movement of information handling system 512 with respect to cooling liquid reservoir 514. In an example, the flow of water among cooling liquid reservoir 514, CDU 510, and information handling system 512 may enable 90% to 100% heat removal the components within component nodes 108 of the information handling system. In certain examples, the 100% heat removal may be based on the components of information handling system 512 utilizing up to a specified amount of power. The specified amount of power may be any suitable amount, such as 30 kW, 50 kW, 100 KW, 150 kW, 150 kw, 240 kW, 245 KW, 250 KW, 255 KW, 260 kW, or the like.

In an example, inlet line 530 may provide the liquid/water to both CDU 510 and information handling system 512. CDU 510 may provide the water to liquid cooling manifolds 522 within information handling system 512 via an inlet line 540 and receive water back from the liquid cooling manifolds via a return line 542. In certain examples, inlet line 540 and return line 542 may be any suitable lines, such as flexible hoses to allow movement of information handling system 512 with respect to CDU 510. CDU 510 may condition the water received from cooling liquid reservoir 514 before the water is provided to liquid cooling manifolds 522 within information handling system 512 via inlet line 540. In certain examples, the conditioning of the water may be any suitable operations to enable direct liquid cooling of components, such as processors in component nodes 108. The conditioning of the water may include, but is not limited to, removing particles from the water, keeping the water temperature above a dew point of system 500, provide a particular flow rate, and prevent condensation on cold plates connected to liquid cooling manifolds 522. In an example, the processors within component nodes 108 may be substantially similar to processors 602 and 604 of FIG. 6.

After CDU 510 has conditioned the cooling liquid, the CDU may provide the water to liquid cooling manifolds 522, which in may provide the water to cold plates in physical communication with the highest-powered devices, such as processors, component nodes 108 within information handling system 512. In this situation, the cold plates, even with warm water, may remove most of the heat produced within information handling system 512. For example, the heat removal from the liquid cooling manifolds 522 and the cold plates may remove around 70%, 75%, 80%, or the like of the heat generated within information handlings system 512. In an example, after the water is circulated through the cold plates and back into the liquid cooling manifolds 522, the water may be provided back to CDU 510 via return line 542. CDU 510 may recirculate the water from liquid cooling manifolds 522 to cooling liquid reservoir 514 via return line 532.

In an example, the water received at information handling system 512 via inlet line 530 may be provided to cooling coils 308. This water may circulate within cooling coils 308 and be provided back to cooling liquid reservoir 514 via return line 532. In certain examples, fans 406 may pull air from component nodes 108 in the direction of arrows 550 and arrow 552. As the air moves in the direction of arrows 550 and arrow 552, the air may travel through cooling coil 308. Cooling coils 308 may include multiple fins to create a large surface area cooled by the cooling liquid traveling though the cooling coils. In this situation, hot air from component nodes 108 may be cooled as the air travels through cooling coils 308 and into fans 406.

In certain examples, the cooler air may be pushed by fans 406 in the directions of arrows 554 through directional vanes 523, around airflow structures 524, through channels 312 and 112, and toward front door 200. As the cooler air reaches front door 200, the airflow may hit inner surface 206 and then be directed toward component nodes 108 via angled portions 210 of airflow director 208. Angled portions 210 may direct the airflow into component nodes 108 and the airflow may remove heat from the component nodes. After the airflow removes heat from component nodes 108, the movement of the airflow may continue as described above.

In an example, rear portion 300 may be disconnected from main portion 100 via any suitable means, such as tool-less latches or the like. In certain examples, the power connection between connect coupler 521 and connect coupler 310 may be disconnected when rear portion 300 is removed from information handling system 512. In this situation, fans 406 and other components within rear portion 300 may be completely de-energized based on the disconnecting of connect couplers 521 and 310.

While cooling of the components within information handling system 512 has been described with respect to both direct liquid cooling from CDU 510 and the air cooling with cooling coils 308 and fans 406, the cooling may be performed only with the air cooling when the power usage within information handling system is below a particular threshold.

Figure 6:
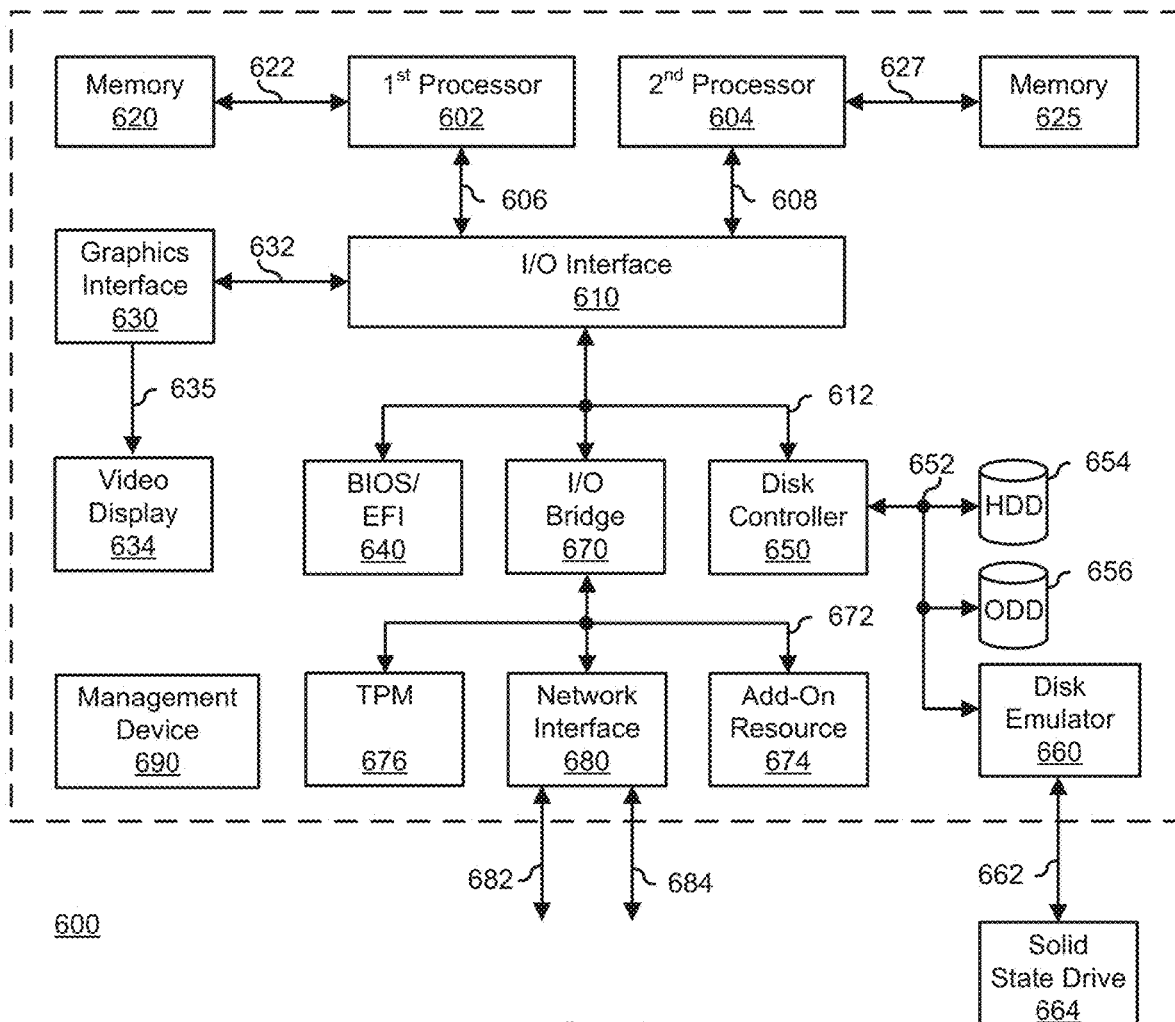
FIG. 6 is a block diagram of a general information handling system according to an embodiment of the present disclosure.

FIG. 6 shows a generalized embodiment of an information handling system 600 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 600 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 600 can include processing resources for executing machine-executable code, such as a central processing unit (CPU), a programmable logic array (PLA), an embedded device such as a System-on-a-Chip (SoC), or other control logic hardware. Information handling system 600 can also include one or more computer-readable medium for storing machine-executable code, such as software or data. Additional components of information handling system 600 can include one or more storage devices that can store machine-executable code, one or more communications ports for communicating with external devices, and various input and output (I/O) devices, such as a keyboard, a mouse, and a video display. Information handling system 600 can also include one or more buses operable to transmit information between the various hardware components.

Information handling system 600 can include devices or modules that embody one or more of the devices or modules described below and operates to perform one or more of the methods described below. Information handling system 600 includes a processors 602 and 604, an input/output (I/O) interface 610, memories 620 and 625, a graphics interface 630, a basic input and output system/universal extensible firmware interface (BIOS/UEFI) module 640, a disk controller 650, a hard disk drive (HDD) 654, an optical disk drive (ODD) 656, a disk emulator 660 connected to an external solid state drive (SSD) 662, an I/O bridge 670, one or more add-on resources 674, a trusted platform module (TPM) 676, a network interface 680, a management device 690, and a power supply 695. Processors 602 and 604, I/O interface 610, memory 620, graphics interface 630, BIOS/UEFI module 640, disk controller 650, HDD 654, ODD 656, disk emulator 660, SSD 662, I/O bridge 670, add-on resources 674, TPM 676, and network interface 680 operate together to provide a host environment of information handling system 600 that operates to provide the data processing functionality of the information handling system. The host environment operates to execute machine-executable code, including platform BIOS/UEFI code, device firmware, operating system code, applications, programs, and the like, to perform the data processing tasks associated with information handling system 600.

In the host environment, processor 602 is connected to I/O interface 610 via processor interface 606, and processor 604 is connected to the I/O interface via processor interface 608. Memory 620 is connected to processor 602 via a memory interface 622. Memory 625 is connected to processor 604 via a memory interface 627. Graphics interface 630 is connected to I/O interface 610 via a graphics interface 632 and provides a video display output 636 to a video display 634. In a particular embodiment, information handling system 600 includes separate memories that are dedicated to each of processors 602 and 604 via separate memory interfaces. An example of memories 620 and 630 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 640, disk controller 650, and I/O bridge 670 are connected to I/O interface 610 via an I/O channel 612. An example of I/O channel 612 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 610 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 640 includes BIOS/UEFI code operable to detect resources within information handling system 600, to provide drivers for the resources, initialize the resources, and access the resources. BIOS/UEFI module 640 includes code that operates to detect resources within information handling system 600, to provide drivers for the resources, to initialize the resources, and to access the resources.

Disk controller 650 includes a disk interface 652 that connects the disk controller to HDD 654, to ODD 656, and to disk emulator 660. An example of disk interface 652 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 660 permits SSD 664 to be connected to information handling system 600 via an external interface 662. An example of external interface 662 includes a USB interface, an IEEE 4394 (Firewire) interface, a proprietary interface, or a combination thereof. Alternatively, solid-state drive 664 can be disposed within information handling system 600.

I/O bridge 670 includes a peripheral interface 672 that connects the I/O bridge to add-on resource 674, to TPM 676, and to network interface 680. Peripheral interface 672 can be the same type of interface as I/O channel 612 or can be a different type of interface. As such, I/O bridge 670 extends the capacity of I/O channel 612 when peripheral interface 672 and the I/O channel are of the same type, and the I/O bridge translates information from a format suitable to the I/O channel to a format suitable to the peripheral channel 672 when they are of a different type. Add-on resource 674 can include a data storage system, an additional graphics interface, a network interface card (NIC), a sound/video processing card, another add-on resource, or a combination thereof. Add-on resource 674 can be on a main circuit board, on separate circuit board or add-in card disposed within information handling system 600, a device that is external to the information handling system, or a combination thereof.

Network interface 680 represents a NIC disposed within information handling system 600, on a main circuit board of the information handling system, integrated onto another component such as I/O interface 610, in another suitable location, or a combination thereof. Network interface device 680 includes network channels 682 and 684 that provide interfaces to devices that are external to information handling system 600. In a particular embodiment, network channels 682 and 684 are of a different type than peripheral channel 672 and network interface 680 translates information from a format suitable to the peripheral channel to a format suitable to external devices. An example of network channels 682 and 684 includes InfiniBand channels, Fibre Channel channels, Gigabit Ethernet channels, proprietary channel architectures, or a combination thereof. Network channels 682 and 684 can be connected to external network resources (not illustrated). The network resource can include another information handling system, a data storage system, another network, a grid management system, another suitable resource, or a combination thereof.

Management device 690 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 600. In particular, management device 690 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 600, such as system cooling fans and power supplies. Management device 690 can include a network connection to an external management system, and the management device can communicate with the management system to report status information for information handling system 600, to receive BIOS/UEFI or system firmware updates, or to perform other task for managing and controlling the operation of information handling system 600.

Management device 690 can operate off of a separate power plane from the components of the host environment so that the management device receives power to manage information handling system 600 when the information handling system is otherwise shut down. An example of management device 690 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 690 may further include associated memory devices, logic devices, security devices, or the like, as needed, or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
a front door including a first frame;
a main portion including a second frame, a component node having multiple components, and a first channel; and
a rear portion including a third frame, a cooling coil, a cooling fan, and a second channel, wherein the information handling system is airtight when the first frame is in physical communication with a first end of the second frame and the third frame is in physical communication with a second end of the second frame, wherein an airflow circulates within the information handling system to cool the components in the component node, wherein the airflow circulates from the cooling coil to the cooling fan, through the second channel, through the first channel, through the component node, and back through the cooling coil.

2. The information handling system of claim 1, wherein the front door further includes an airflow director, wherein the airflow director angles the airflow toward the component node.

3. The information handling system of claim 2, wherein the airflow director includes first and second angled portions and a flat portion, wherein a direction of the airflow toward the component node varies based a width of the flat portion and angles of the angled portions.

4. The information handling system of claim 1, wherein the main portion includes a support and a mounting structure in physical communication with the support, wherein the first channel is located between the mounting structure and the second frame.

5. The information handling system of claim 1, wherein the rear portion further includes a mounting structure connected between the cooling fan and the cooling coil, wherein the second channel is located between the mounting structure and the third frame.

6. The information handling system of claim 1, wherein the first channel in the main portion aligns with the second channel in the rear portion when the rear portion is in physical communication with the main portion.

7. The information handling system of claim 1, wherein the rear portion further includes directional vanes to direct the airflow from the cooling fan toward the second channel.

8. The information handling system of claim 1, further comprising a first connect coupler within the main portion and a second connect coupler within the rear portion, wherein power is provided from the main portion to the rear portion while the first and second connect coupler are coupled together.

9. A system comprising:
a cooling distribution unit to provide a cooling liquid; and
an information handling system to receive the cooling liquid from the cooling distribution unit, the information handling system including:
a front door including a first frame;
a main portion including a second frame, a component node having multiple components, and a first channel; and a rear portion including a third frame, a cooling coil, a cooling fan, and a second channel, wherein the information handling system is airtight when the first frame is in physical communication with a first end of the second frame and the third frame is in physical communication with a second end of the second frame, wherein an airflow circulates within the information handling system to cool the components in the component node, wherein the airflow circulates from the cooling coil to the cooling fan, through the second channel, through the first channel, through the component node, and back through the cooling coil.

10. The system of claim 1, wherein the front door further includes an airflow director, wherein the airflow director angles the airflow toward the component node.

11. The system of claim 10, wherein the airflow director includes first and second angled portions and a flat portion, wherein a direction of the airflow toward the component node varies based a width of the flat portion and angles of the angled portions.

12. The system of claim 1, wherein the main portion includes a support and a mounting structure in physical communication with the support, wherein the first channel is located between the mounting structure and the second frame.

13. The system of claim 1, wherein the rear portion further includes a mounting structure connected between the cooling fan and the cooling coil, wherein the second channel is located between the mounting structure and the third frame.

14. The system of claim 1, wherein the first channel in the main portion aligns with the second channel in the rear portion when the rear portion is in physical communication with the main portion.

15. The system of claim 1, wherein the rear portion further includes directional vanes to direct the airflow from the cooling fan toward the second channel.

16. The system of claim 1, wherein the information handling system further comprises a first connect coupler within the main portion and a second connect coupler within the rear portion, wherein power is provided from the main portion to the rear portion while the first and second connect coupler are coupled together.

17. An information handling system comprising:
a main portion including a first frame, a component node having multiple components, and a first channel;
a front door including a second frame and an airflow director, wherein the airflow director angles an airflow toward the component node; and
a rear portion including a third frame, a cooling coil, a cooling fan, a second channel, and directional vanes to direct the airflow from the cooling fan toward the second channel, wherein the information handling system is airtight when the second frame is in physical communication with a first end of the first frame and the third frame is in physical communication with a second end of the first frame, wherein the airflow circulates within the information handling system to cool the components in the component node, wherein the airflow circulates from the cooling coil, to the cooling fan, through the second channel, through the first channel, through the component node, and back through the cooling coil.

18. The information handling system of claim 17, wherein the airflow director includes first and second angled portions and a flat portion, wherein a direction of the airflow toward the component node varies based a width of the flat portion and angles of the angled portions.

19. The information handling system of claim 1, wherein the main portion includes a support and a mounting structure in physical communication with the support, wherein the first channel is located between the mounting structure and the first frame.

20. The information handling system of claim 1, wherein the rear portion further includes a mounting structure connected between the cooling fan and the cooling coil, wherein the second channel is located between the mounting structure and the third frame.

* * * * *